United States Patent [19]
Mori

[11] Patent Number: 5,443,707
[45] Date of Patent: Aug. 22, 1995

[54] APPARATUS FOR ELECTROPLATING THE MAIN SURFACE OF A SUBSTRATE

[75] Inventor: Hiroyuki Mori, Tokyo, Japan

[73] Assignee: NEC Corporation, Japan

[21] Appl. No.: 361,865

[22] Filed: Dec. 23, 1994

Related U.S. Application Data

[63] Continuation of Ser. No. 89,761, Jul. 9, 1993, abandoned.

[30] Foreign Application Priority Data

Jul. 10, 1992 [JP] Japan .................... 4-182753

[51] Int. Cl.⁶ .................... C25D 17/00; C25D 17/12
[52] U.S. Cl. .................... 204/242; 204/245; 204/275; 204/284
[58] Field of Search .................... 204/224 R, 284, 275, 204/280, DIG. 7, 242, 245

[56] References Cited
FOREIGN PATENT DOCUMENTS
19147  2/1978  Japan .

Primary Examiner—John Niebling
Assistant Examiner—Edna Wong
Attorney, Agent, or Firm—Laff, Whitesel, Conte & Saret, Ltd.

[57] ABSTRACT

An apparatus for electroplating a semiconductor substrate with a metallic film having a uniform thickness. Such a metallic film with a uniform thickness is formed by adjusting the arrangement of the anode so that the intensity distribution of the electric field generating on the main surface to be plated is made substantially uniform. The diameter of the anode is equal to or smaller than one-half that of the main surface of the semiconductor substrate so that the intensity distribution of the electric field on the main surface is substantially uniform. Further, the anode is formed into a mesh which amounts to an area factor equal to or smaller than 50%, which permits the fluctuation of the flux distribution of the plating solution to be neglected.

20 Claims, 4 Drawing Sheets

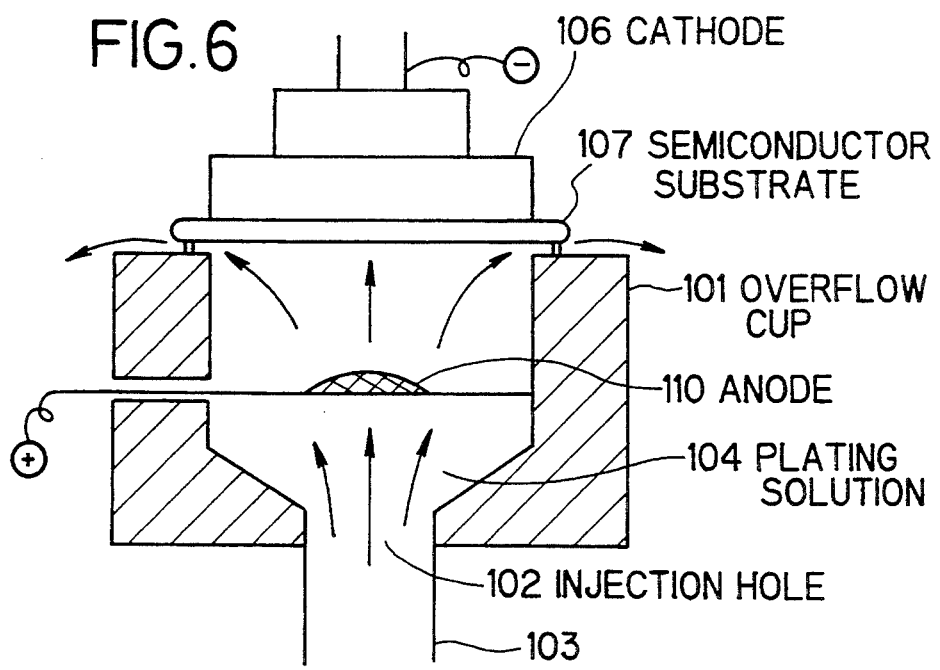
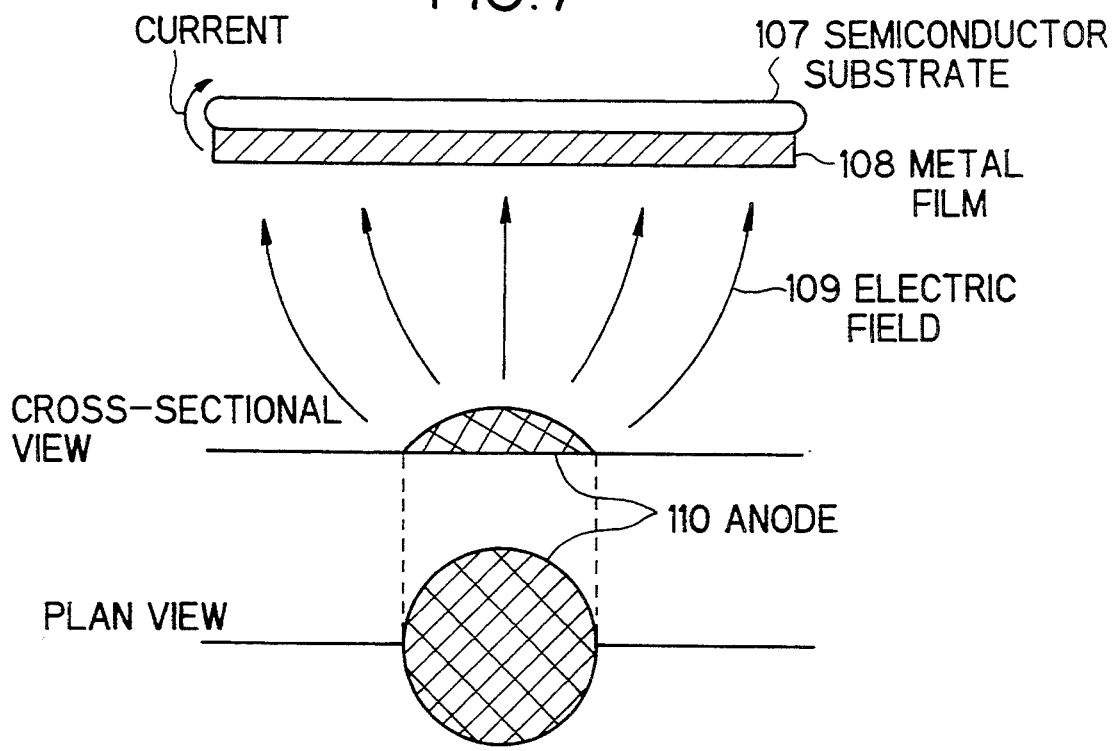

APPARATUS FOR ELECTROPLATING THE MAIN SURFACE OF A SUBSTRATE

This application is a continuation of application Ser. No. 08/089,761, filed Jul. 9, 1993, now abandoned.

FIELD OF THE INVENTION

The present invention relates to an electroplating apparatus and, in particular, to an apparatus for metal plating the main surface of a substrate.

BACKGROUND OF THE INVENTION

In a process of manufacturing an integrated circuit, there are steps where a thin metallic film is deposited and then partially removed to form metallic conductor wires on a semiconductor substrate.

From the view point of its cost performance and yield, the thickness of the metallic film is preferably as uniform as possible. As one of methods to efficiently obtain such a metallic film, a metal plating technique may be employed.

A conventional plating technique is hereinafter described with reference to FIGS. 1 and 2. Such a metal plating apparatus has been described in "Introducing TAB Technology" by Kenzo Hatada (published by Kogyo Chosakai Publicing Co. on Jan. 25, 1990).

FIG. 1 is a cross-sectional view of a conventional metal electroplating apparatus. As shown in FIG. 1, an overflow cup 1 is a plating tank having an opening on the top and an injection hole 2 on the bottom thereof. The injection hole 2 is connected to an injection line 3 to introduce plating solution 4 into the cup 1. The plating solution 4 flows upwardly and overflows the cup 1. The cup 1 is also provided with a circular mesh-shaped anode 5 therein.

A cathode 6 is capable of absorbing a circular semiconductor substrate 7 on the bottom thereof and of supplying a current to the main surface of the semiconductor substrate 7 to be plated.

The main surface of the semiconductor substrate 7 faces the mesh-shaped anode 5 in parallel with each other. The diameter of the mesh-shaped anode 5 is equal to or greater than that of the semiconductor substrate 7.

Next, the operation of the foregoing arrangement is described. First, the cathode 6 absorbs and fixes the semiconductor substrate 7 and a plating solution 4 is supplied into the cup 1 from an injection hole 2. The injected plating solution 4 flows upwardly through the mesh-shaped anode 5 and overflows the cup 1 while getting in substantially uniform contact with the main surface of the semiconductor substrate 7. In this condition, rotating the semiconductor substrate 7, a current is supplied from the anode 5 to the cathode 6 for electroplating the main surface of the semiconductor substrate 7 with a metallic film.

As shown in FIG. 2, however, the metallic film 8 formed on the main surface of the semiconductor substrate 7 is not uniform in thickness. This is caused by the following phenomena. The current for electroplating flows from the mesh-shaped anode 5 to the main surface of the semiconductor substrate 7, and further flows through the conductor layer of the main surface and the conductor of the outer peripheral portion of the semiconductor substrate 7, and then reaches the cathode 6. Therefore, the nearer a portion of the main surface of the semiconductor substrate 7 lies to the outer peripheral portion thereof, the lower its potential is. On the other hand, the mesh-shaped anode 5 is formed with the same diameter as that of the semiconductor substrate 7 and has a uniformly high potential. Therefore, an electric field 9 generating between the semiconductor substrate 7 and the anode 5 becomes smaller at a portion nearer to the center of the semiconductor substrate 7, while becoming greater at a portion nearer to its outer peripheral portion. Under this condition, since the plating solution 4 is in uniform contact with the whole main surface of the semiconductor substrate 7, the portion which is nearer to the outer peripheral portion attracts more metallic ions so that it may be plated more thickly as shown in FIG. 2.

That is, the conventional plating apparatus has a problem that the metallic film 8 formed on the semiconductor substrate 7 has a nonuniformity of thickness.

SUMMARY OF THE INVENTION

An electroplating apparatus according to the present invention is generally comprised of a plating tank for containing a plating solution, a cathode capable of holding a substrate having a main surface to be plated, and an anode mounted in the plating tank such that the anode faces the main surface with the central axis of the anode coincident with the central axis of the main surface.

The main surface of the substrate is comprised of a conductor which is electrically connected to the cathode and is capable of coming in contact with the plating solution in the tank.

The anode has a diameter smaller than the main surface so that the intensity distribution of the electric field in the vicinity of the main surface is substantially uniform.

Preferably, the diameter of the anode is equal to or smaller than one-half, more preferably one-third, that of the main surface.

Further, the anode preferably has a curved arrangement in which the convex surface faces toward the main surface.

The anode is preferably formed into a mesh which amounts to an area factor equal to or smaller than 50%, the area factor being defined by the area ratio of the wire portion relative to said whole anode.

BRIEF DESCRIPTION OF THE DRAWINGS

FIG. 6 is a cross-sectional view of the metal plating apparatus according to a second embodiment of the present invention; and FIG. 7 is an enlarged cross-sectional view of the anode and the cathode of the first embodiment.

DETAILED DESCRIPTION OF THE PREFERRED EMBODIMENTS

The present invention is hereinafter described with reference to the accompanying drawings.

Figure 1:
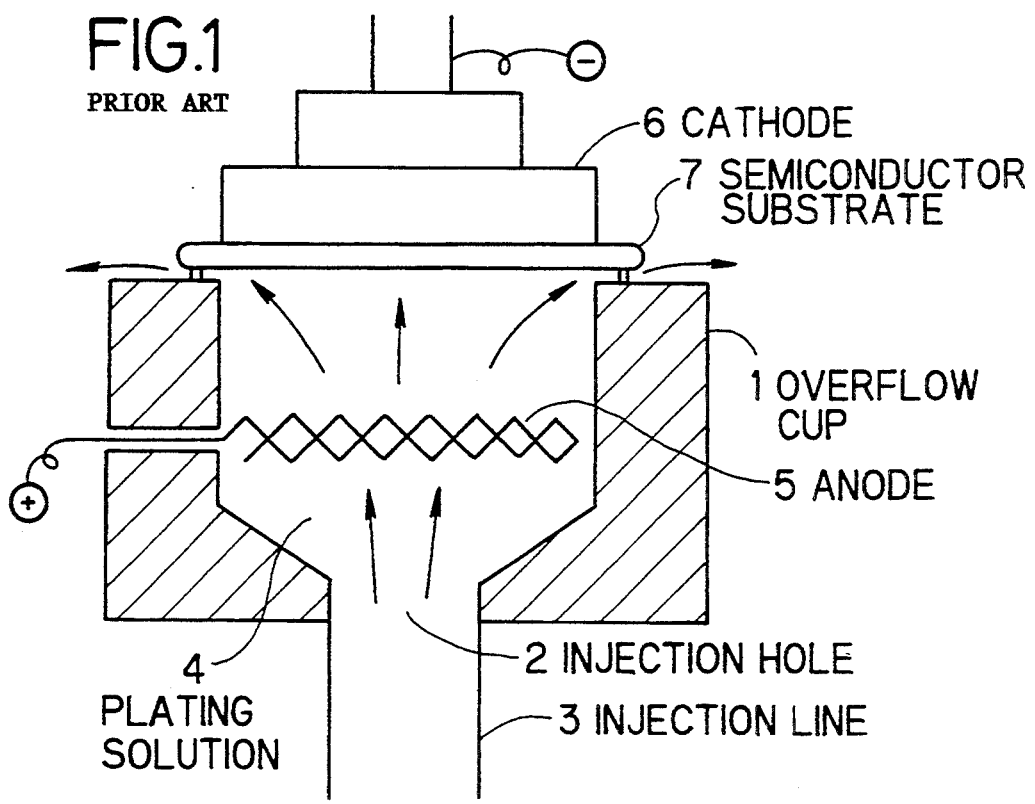
FIG. 1 is a cross-sectional view of a conventional metal plating apparatus.
Figure 2:
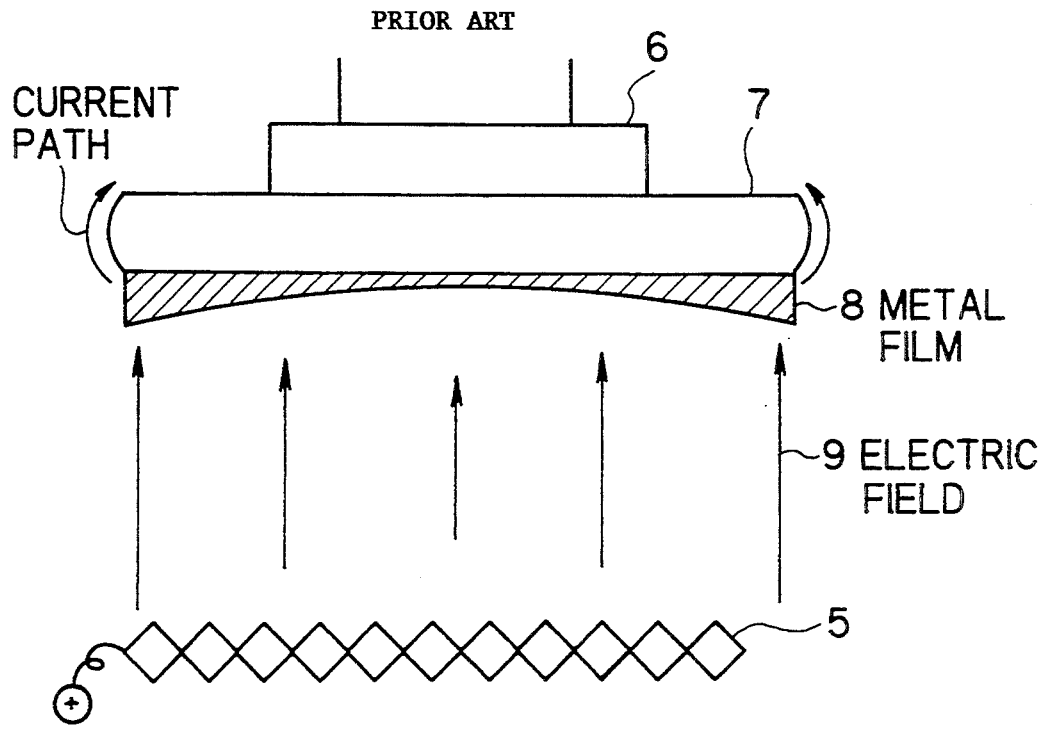
FIG. 2 is an enlarged cross-sectional view of the anode and the cathode of a conventional metal plating apparatus.
Figure 3:
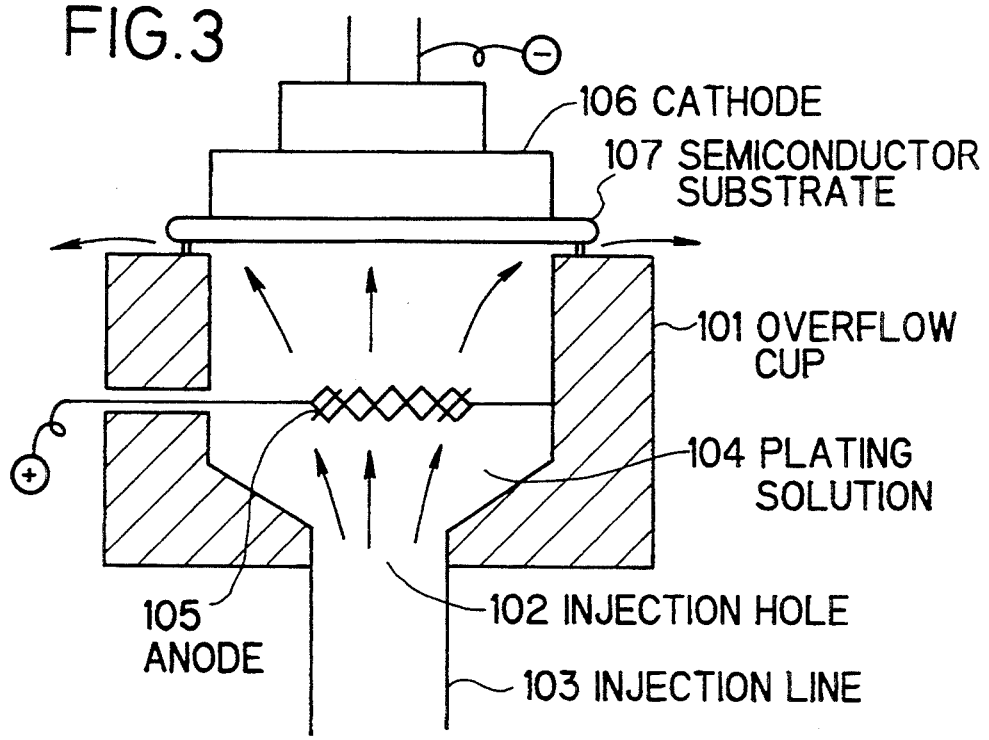
FIG. 3 is a cross-sectional view of a metal plating apparatus according to a first embodiment of the present invention.

As shown in FIG. 3, an overflow cup 101 is a plating tank having an opening on the top and an injection hole 102 on the bottom thereof. The injection hole 102 is connected to an injection line 103 to introduce a plating solution 104 into the cup 101. The plating solution 104 may contain one of metallic ions such as gold, copper, nickel or the like. The cup 101 is also provided with a circular mesh-shaped anode 105 therein.

A cathode 106 is capable of absorbing a circular semiconductor substrate 107 on the bottom thereof. The main surface of the semiconductor substrate 107 is comprised of a conductor layer which is continuously formed down to the rear surface in contact with the cathode 106. Therefore, the cathode 106 can supply a current to the main surface of the semiconductor substrate 107 to be plated.

The semiconductor substrate 107 absorbed by the cathode 106 is located as covering the opening on the top of the cup 101. The main surface to be plated faces the mesh-shaped anode 105 in parallel with each other. The cathode 106 and the semiconductor substrate 107 may be rotated about the vertical axis which is coincident with the extension of the central axis of the mesh-shaped anode 105.

Figure 4:
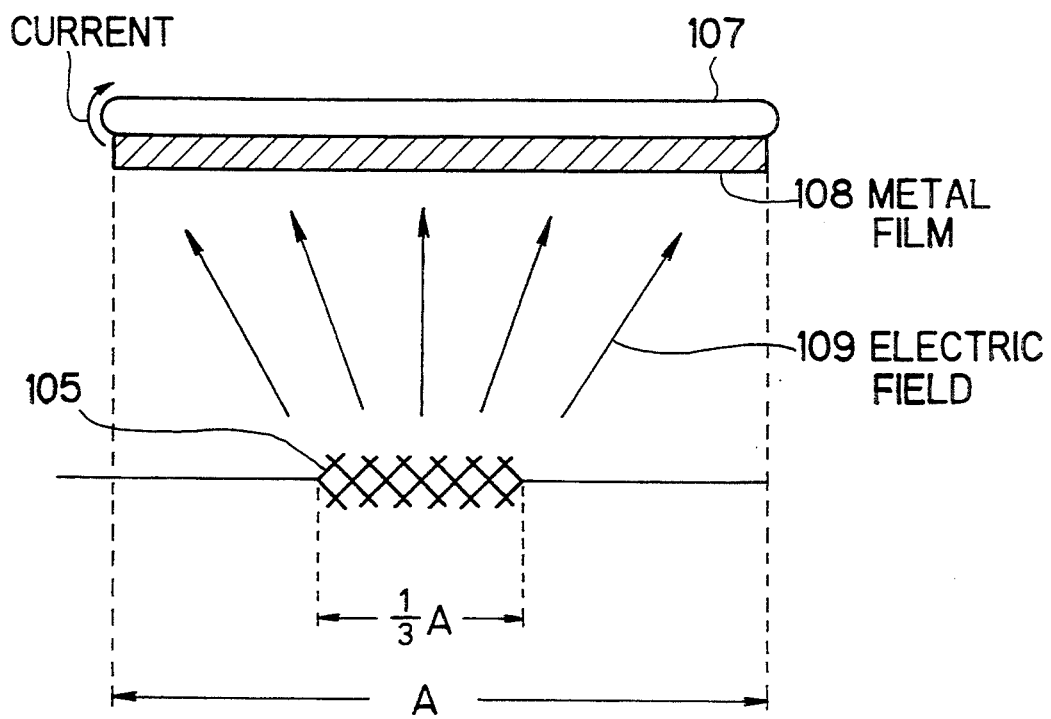
FIG. 4 is an enlarged cross-sectional view of the anode and the cathode of the first embodiment.

As shown in FIG. 4, the mesh-shaped anode 105 has a diameter of one third of that of the semiconductor substrate 107 and amounts to 50% in area factor defined by the area ratio of the metal portion relative to the whole mesh-shaped anode 105.

Next, the operation of the embodiment is described. First, the cathode 106 gets contact with the rear surface of the semiconductor substrate 107 and fixes it by means of vacuum adsorption. Further, the plating solution 104 is supplied into the cup 1 from an injection hole 102 through the injection line 103 by means of a plating solution injecting pump (not shown). The injected plating solution 104 flows upwardly through the mesh-shaped anode 105 with the area factor of 50% and overflows the cup 101 while getting in substantially uniform contact with the whole main surface of the semiconductor substrate 107 to be plated. In this condition, rotating the semiconductor substrate 107, a current is supplied from the anode 105 to the cathode 106 for electroplating the main surface of the semiconductor substrate 107 with a metallic film.

At this time, the current flows from the main surface to the cathode 106 through the outer peripheral portion of the semiconductor substrate 107. Therefore, a potential difference is generated in the main surface of the semiconductor substrate 107 such that the nearer a portion of the main surface lies to the outer peripheral portion, the lower its potential is.

On the other hand, as described above, the mesh-shaped anode 105 is provided with a diameter of one third of that of the semiconductor substrate 107, and is on a uniformly high potential level. In consequence, as shown in FIG. 4, the nearer a portion of the main surface of the semiconductor substrate 107 lies to the outer peripheral portion, the more the portion is distant from the mesh-shaped anode 105. This distance between the portion of the main surface and the mesh-shaped anode 105 can be further made greater if the diameter of the mesh-shaped anode 105 is made smaller.

Since the potential at a portion of the main surface nearer to the outer peripheral portion becomes lower, the potential difference between the nearer portion and the mesh-shaped anode 105 becomes greater, but the magnitude of this potential difference cannot significantly change even if the diameter of the anode 105 is changed.

Therefore, the magnitude of the electric field 109 in the vicinity of the main surface of the semiconductor substrate 107, varying according to the distance from the outer peripheral portion of the main surface, can be controlled by changing the diameter of the mesh-shaped anode 105. That is, if the diameter of the anode 105 is made smaller down to about one third of that of the semiconductor substrate 107, then the magnitude of the electric field 109 becomes smaller, resulting in a more uniform magnitude of the electric field in the vicinity of the whole main surface of the semiconductor substrate 107.

The area factor of the mesh-shaped anode 105, as mentioned above, is designed to be equal to or smaller than 50%. Since the mesh-shaped anode in the cup 101 is provided on the central axis of the semiconductor substrate 107, the plating solution 104 injected from the injection hole 102 into the cup 101 and flowing through the mesh-shaped anode is not uniform in distribution of the flow rate. The injected plating solution 104 has a greater chance that it comes in contact with the portion near to the outer peripheral portion of the main surface of the semiconductor substrate 107. In consequence, the nearer a portion of the main surface lies to the outer peripheral portion, the greater the metallic ion concentration of the plating solution 104 becomes.

Such unevenness of the metallic ion concentration according to the distance from the outer peripheral portion of the main surface can be made smaller by making the area factor of the mesh-shaped anode smaller, that is, by taking the greater area ratio of the openings of the mesh-shaped anode which the plating solution 104 can pass through so that the plating solution 104 comes in more uniform contact with the main surface of the semiconductor substrate 107.

According to our experiment, the area factor of the mesh-shaped anode 105, if it amounts to 50% or below, will not practically lend itself to the unevenness of the thickness of the metallic film 108 deposited on the main surface. In this embodiment, the area factor of the mesh-shaped anode 105 is set to 50%.

Figure 5:
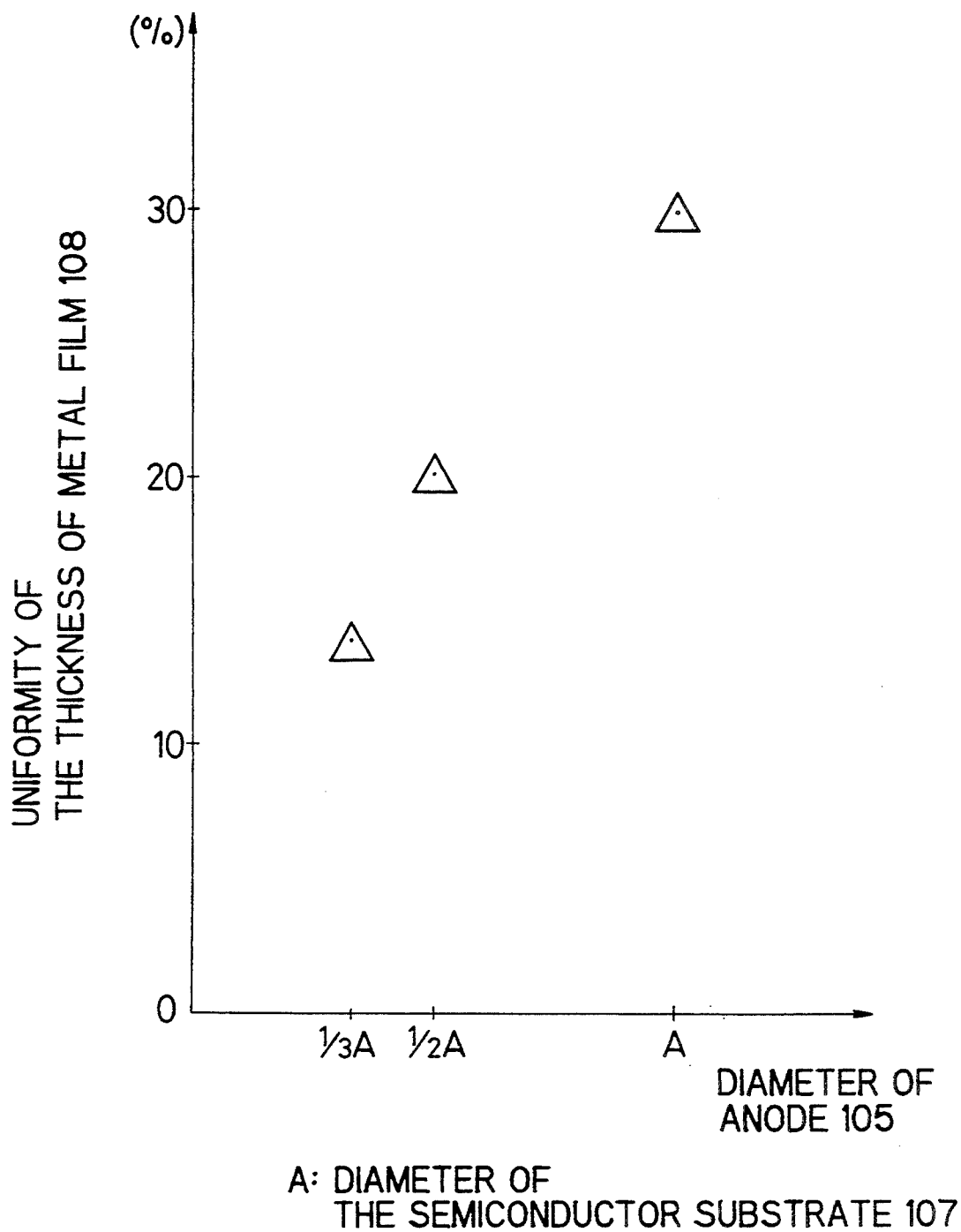
FIG. 5 is a graphic view illustrating the uniformity of the thickness of a metallic film according to the first embodiment of the present invention.

FIG. 5 is a graphic view of the uniformity of the thickness of the metallic film 108 as a function of the diameter of the mesh-shaped anode 105 when the area factor of the mesh-shaped anode 105 amounts to 50%, provided the diameter of the mesh-shaped anode 105 is represented by using the diameter A of the semiconductor substrate 107 as a unit.

Referring to FIG. 5, if the diameter of mesh-shaped anode 105 equals the diameter A of the semiconductor substrate 107, then the metallic film 108 is subject to about 30% variation in thickness. If the diameter of the mesh-shaped anode 105 is made smaller than that of the semiconductor substrate 107, then the variation also becomes smaller and, if the diameter of the mesh-shaped anode 105 is set to ½ A, then the variation is reduced down to about 20%, and if ⅓ A, it becomes about 14%.

In the graph of FIG. 5, a triangular mark schematically represents the magnitude of the error included in the uniformity degree of the thickness of the metallic film 108 according to the distance from the outer peripheral portion of the main surface because the uniformity degree varies for each semiconductor substrate.

According to our experiment, when the diameter of the mesh-shaped anode 105 is equal to or smaller than ½ A, the variation of the thickness of the metallic film 108 can always be improved as compared with the case where the diameter is equal to A, regardless of whether any error is present. Therefore, the mesh-shaped anode 105 with a diameter of ½ A or below causes the production yield to be dramatically improved.

In this embodiment, the diameter of the mesh-shaped anode 105 is set to ⅓ A. This makes the variation of the thickness of the metallic film 108 further smaller. According to this embodiment, when the metal plating is carried out, it is possible to securely suppress the unevenness of the thickness of the metallic film 108 small.

FIG. 6 is a cross-sectional view of the metal plating apparatus according to a second embodiment of the present invention. The same reference numerals in FIG. 6 as those in FIG. 3 indicates the same members.

As shown in FIG. 6, a cup 101 has an opening on the top and an injection hole 102 on the bottom thereof. The injection hole 102 is connected to an injection line 103 to introduce a plating solution 104 into the cup 101. The plating solution 104 may contain one of metallic ions such as gold, copper, nickel or the like. The cup 101 is also provided with a circular mesh-shaped anode 110 having a curved arrangement therein.

A cathode 106 is capable of absorbing a circular semiconductor substrate 107 on the bottom thereof. The main surface of the semiconductor substrate 107 is comprised of a conductor layer which is continuously formed down to the rear surface in contact with the cathode 106 to supply a current to the main surface.

The semiconductor substrate 107 absorbed by the cathode 106 is located as covering the opening on the top of the cup 101. The main surface to be plated faces the mesh-shaped anode 110. The cathode 106 and the semiconductor substrate 107 may be rotated about the vertical axis which is coincident with the extension of the central axis of the mesh-shaped anode 110.

As shown in FIG. 7, the mesh-shaped anode 110 has a diameter of one third that of the semiconductor substrate 107 and amounts to 50% in area factor defined by the area ratio of the metal portion relative to the whole mesh-shaped anode 110.

The area factor of the mesh-shaped anode 110, as mentioned above, is designed to be equal to or smaller than 50%. According to our experiment, the area factor of the mesh-shaped anode 110, if it amounts to 50% or below, will not practically lend itself to the unevenness of the thickness of the metallic film 108 deposited on the main surface. In this embodiment, the area factor of the mesh-shaped anode 110 is set to 50%.

Further, the mesh-shaped anode 110 has an upwards convex surface which is a convex surface toward the semiconductor substrate 107.

Next, the operation of the embodiment is described. First, the cathode 106 comes in contact with the rear surface of the semiconductor substrate 107 and fix it by means of vacuum adsorption. Further, the plating solution 104 is supplied into the cup 101 from an injection hole 102 through the injection line 103. The injected plating solution 104 flows upwardly through the mesh-shaped anode 110 with the area factor of 50% and overflows the cup 101 while getting in substantially uniform contact with the whole main surface of the semiconductor substrate 107 to be plated. In this condition, rotating the semiconductor substrate 107, a current is supplied from the anode 110 to the cathode 106 for electroplating the main surface of the semiconductor substrate 107 with a metallic film.

At this time, the current flows from the main surface to the cathode 106 through the outer peripheral portion of the semiconductor substrate 107. Therefore, a potential difference is generated in the main surface of the semiconductor substrate 107 such that the nearer a portion of the main surface lies to the outer peripheral portion, the lower its potential is.

On the other hand, as described above, the mesh-shaped anode 110 is provided with a diameter of one third of that of the semiconductor substrate 107, and is on a uniformly high potential level. In consequence, as shown in FIG. 7, the nearer a portion of the main surface of the semiconductor substrate 107 lies to the outer peripheral portion, the more the portion is distant from the mesh-shaped anode 110. This distance between the portion of the main surface and the mesh-shaped anode 110 can be further made greater if the diameter of the mesh-shaped anode 110 is made smaller.

Since the potential at a portion of the main surface nearer to the outer peripheral portion becomes lower, the potential difference between the nearer portion and the mesh-shaped anode 110 becomes greater, but the magnitude of this potential difference cannot significantly change even if the diameter of the anode 110 is changed.

Therefore, the magnitude of the electric field 109 in the vicinity of the main surface of the semiconductor substrate 107, varying according to the distance from the outer peripheral portion of the main surface, can be controlled by changing the diameter of the mesh-shaped anode 110. That is, if the diameter of the anode 110 is made smaller down to about one third of that of the semiconductor substrate 107, then the magnitude of the electric field 109 becomes smaller, resulting in a more uniform magnitude of the electric field in the vicinity of the whole main surface of the semiconductor substrate 107.

In order to achieve a further more uniform magnitude of the electric field 109 in the vicinity of the whole main surface, this embodiment employs the mesh-shaped anode 110 having the upwards convex surface as well as the diameter of one third that of the semiconductor substrate 107. As shown in FIG. 7, the upwards convex surface of the mesh-shaped anode 110 allows the magnitude of the electric field 109 on the main surface to be adjusted finely.

In this embodiment, the magnitude of the electric field 109 on the main surface of the semiconductor substrate 107 is made close to the uniform condition by the convex surface of the mesh-shaped anode 105 toward the semiconductor substrate 107. This causes the variation of the thickness of the metallic film 108 to be reduced by further several percent as compared with the case in which the mesh-shaped anode has no convex surface. That is, according to this embodiment, the metallic film 108 having an extremely small variation in thickness can be achieved.

As described above, according to the metal plating apparatus of the present invention, the unevenness of the potential distribution of the main surface of the semiconductor substrate to be plated is corrected by adjusting the diameter of the anode so that the intensity distribution of the electric field on the main surface becomes substantially uniform. Therefore, it is possible to form the metallic film having a uniform thickness to thereby remarkably improve the performance and yield of the semiconductor substrate.

What is claimed is:

1. An apparatus for electroplating a main surface of a substrate, said apparatus comprising:
   a plating cup for containing a plating solution;
   a cathode for holding a substrate having a circular main surface which is to be plated, said main surface comprising a conductor which is electrically connected to said cathode, and said main surface being located to come into contact with said plating solution; and
   a circular anode provided within said plating cup such that said anode faces said main surface with a central axis of said anode coincident with a central axis of said main surface, said circular anode having a diameter which is equal to or smaller than one-third of the diameter of said circular main surface.

2. An apparatus for electroplating a main surface of a substrate, said apparatus comprising:
   a plating tank for containing a plating solution;
   a cathode for holding a substrate having a main surface which is to be plated, said main surface comprising a conductor which is electrically connected to said cathode, and said main surface being located to come in contact with said plating solution; and
   an anode provided within said plating tank so that said anode faces said main surface with a central axis of said anode coincident with a central axis of said main surface, a plane area of said anode being no larger than one-ninth of a plane area of said main surface.

3. An apparatus for electroplating a main surface of a substrate, said apparatus comprising:
   a plating cup for containing a plating solution, said plating cup having an injection hole, said injection hole being connected to an injection line for introducing said plating solution into said plating cup;
   said plating cup having a cylindrical portion located apart from said injection hole, the inner diameter of said cylindrical portion being a constant value;
   a cathode for holding a substrate having a circular main surface which is to be plated, said main surface comprising a conductor which is electrically connected to said cathode, and said main surface being located to come into contact with said plating solution; and
   a circular anode provided within said cylindrical portion of said plating cup so that said circular anode faces said circular main surface with a central axis of said circular anode coincident with a central axis of said circular main surface, said circular anode having a diameter which is smaller than said inner diameter of said cylindrical portion.

4. The apparatus as defined in claim 3, wherein said circular anode has a diameter which is no greater than one-half of said inner diameter of said cylindrical portion.

5. The apparatus as defined in claim 3, wherein said circular anode has a diameter which is no greater than one-third of said inner diameter of said cylindrical portion.

6. The apparatus as defined in claim 1, wherein said plating cup comprises an overflow cup and said circular anode is formed in a mesh.

7. The apparatus as defined in claim 1, wherein: said plating cup has an opening on the top, and said circular anode is formed in a mesh with an area factor equal to or smaller than 50%, said area factor being defined by a ratio of the area of a wire portion of said mesh relative to an entire area of said anode.

8. The apparatus as defined in claim 1, wherein said circular anode has a curved arrangement in which a convex anode surface faces toward said circular main surface.

9. The apparatus as defined in claim 2, wherein said anode has a curved arrangement in which a convex anode surface faces toward said circular main surface.

10. The apparatus as defined in claim 3, wherein said circular anode has a curved arrangement in which a convex anode surface faces toward said circular main surface.

11. The apparatus as defined in claim 4, wherein said circular anode has a curved arrangement in which a convex anode surface faces toward said circular main surface.

12. The apparatus as defined in claim 5, wherein said circular anode has a curved arrangement in which a convex anode surface faces toward said circular main surface.

13. The apparatus as defined in claim 1, wherein said circular anode is formed into a mesh which has an area factor equal to or smaller than 50%, said area factor being defined by a ratio of the area of a wire portion of said mesh relative to an entire area of said anode.

14. The apparatus as defined in claim 3, wherein said circular anode is formed into a mesh which has an area factor equal to or smaller than 50%, said area factor being defined by a ratio of the area of a wire portion of said mesh relative to an entire area of said anode.

15. The apparatus as defined in claim 4, wherein said circular anode is formed into a mesh which has an area factor equal to or smaller than 50%, said area factor being defined by a ratio of the area of a wire portion of said mesh relative to an entire area of said anode.

16. The apparatus as defined in claim 5, wherein said circular anode is formed into a mesh which has an area factor equal to or smaller than 50%, said area factor being defined by a ratio of the area of a wire portion of said mesh relative to an entire area of said anode.

17. The apparatus as defined in claim 1, wherein said circular anode has a curved arrangement in which a convex anode surface faces toward said circular main surface, and is formed into a mesh which has an area factor equal to or smaller than 50%, said area factor being defined by a ratio of the area of a wire portion of said mesh relative to an entire area of said anode.

18. The apparatus as defined in claim 3, wherein said circular anode has a curved arrangement in which a convex anode surface faces toward said circular main surface, and is formed into a mesh which has an area factor equal to or smaller than 50%, said area factor being defined by a ratio of the area of a wire portion of said mesh relative to an entire area of said anode.

19. The apparatus as defined in claim 4, wherein said circular anode has a curved arrangement in which a convex anode surface faces toward said circular main surface, and is formed into a mesh which has an area factor equal to or smaller than 50%, said area factor being defined by a ratio of the area of a wire portion of said mesh relative to an entire area of said anode.

20. The apparatus as defined in claim 5, wherein said circular anode has a curved arrangement in which a convex anode surface faces toward said circular main surface, and is formed into a mesh which has an area factor equal to or smaller than 50%, said area factor being defined by ratio of the area of a wire portion of said mesh relative to an entire area of said anode.

* * * * *